United States Patent

Ohsawa

[11] Patent Number: 5,999,438
[45] Date of Patent: Dec. 7, 1999

[54] FERROELECTRIC STORAGE DEVICE

[75] Inventor: Tosimasa Ohsawa, Kanagawa, Japan

[73] Assignee: Sony Corporation, Tokyo, Japan

[21] Appl. No.: 09/075,346

[22] Filed: May 11, 1998

[30] Foreign Application Priority Data

May 12, 1997 [JP] Japan .................... P09-121142

[51] Int. Cl.$^6$ .................................... G11C 11/22
[52] U.S. Cl. ................... 365/145; 365/149; 365/189.07
[58] Field of Search .................... 365/145, 149, 365/189.07

[56] References Cited

U.S. PATENT DOCUMENTS 5,640,030  6/1997  Kenney .................... 365/145

Primary Examiner—Huan Hoang

[57] ABSTRACT

A ferroelectric storage device enabling an increase of capacity without a major increase in the chip size by use of multi-level data. At the time of a write operation, one of four types of potential based on the 2 bits of data input to the I/O terminal is selectively supplied from a potential generator to a bit line through a data line. The potential is supplied to one of the electrodes of a ferroelectric capacitor where one of four types of residual polarization states is selectively produced at the ferroelectric. By this, 4-level data is stored in a single memory cell. At the time of a read operation, the potential of the bit line is compared with three reference potentials at an output data generator to discriminate the stored data.

11 Claims, 6 Drawing Sheets

| OUTPUT OF COMPARATOR 51 | 1 | 0 | 0 | 0 |
| OUTPUT OF COMPARATOR 52 | 1 | 1 | 0 | 0 |
| OUTPUT OF COMPARATOR 53 | 1 | 1 | 1 | 0 |
| | ↓ | ↓ | ↓ | ↓ |
| DATA | (1,1) | (1,0) | (0,1) | (0,0) |
| POTENTIAL OF BIT LINE | A | B | C | D |

FERROELECTRIC STORAGE DEVICE

BACKGROUND OF THE INVENTION

1. Field of the Invention

The present invention relates to a ferroelectric storage device utilizing the reversability of polarization of a ferroelectric.

2. Description of the Related Art

As a ferroelectric nonvolatile memory for storing binary data by utilizing the reversability of polarization of a ferroelectric having a hysteresis characteristic as shown in FIG. 1, a variety of memories are proposed at present.

In such a ferroelectric nonvolatile memory for storing binary data, one bit of digital data of "1" or "0" is stored in each memory cell and the memory capacity corresponds to the number of memory cells.

Accordingly, in order to increase the memory capacity in such a ferroelectric nonvolatile memory, the number of memory cells must be increased. In so far as the degree of integration is not raised, the size of the chip was consequently increased along with the memory capacity.

In recent years, however, along with demands for increasing the capacity of ferroelectric nonvolatile memories, there has been the problem that the memory would become large in size if the number of memory cells were increased along with the increase of the memory capacity.

In view of such a problem, Japanese Unexamined Patent Publication (Kokai) No. 6-196647 discloses a ferroelectric nonvolatile memory capable of increasing the memory capacity without an increase of the chip size by storing multi-level data in a memory cell.

In this ferroelectric nonvolatile memory, each memory cell is provided with a write word line, a read use word line, a write bit line, and a read bit line in addition to a metal-ferroelectric-semiconductor (MFS) transistor, a write use metal oxide semiconductor (MOS) transistor, and a read use MOS transistor. Here, an MFS transistor is a transistor obtained by forming a ferroelectric such as PLZT (Pb,La)(Zr,Ti)O$_3$) on a gate oxide film.

In this ferroelectric nonvolatile memory, at the time of a write operation, residual polarization based on the analog data or multi-level data is generated in a ferroelectric film of the MFS transistor to directly nonvolatilely store the data. Further, at the time of a read operation, the read MOS transistor is turned on and the drain current based on the residual polarization of the ferroelectric film flowing between the drain and source of the MOS transistor is detected to read the stored data.

In this ferroelectric nonvolatile memory, multi-level data at least trinary or analog data is directly written into or read from each memory cell without the use of an analog-to-digital (A/D) converter, a digital-to-analog (D/A) converter, or other data converter.

SUMMARY OF THE INVENTION

The present invention was made with the related art as its background and has as an object thereof to provide a ferroelectric storage device capable of achieving an increase of capacity without a major increase in the chip size.

To attain the above object, according to a first aspect of the present invention, there is provided a ferroelectric storage device comprising word lines; bit lines; ferroelectric capacitors; transistors switching the bit lines and one of the electrodes of the ferroelectric capacitors selectively to a connected state and disconnected state; and a potential generating means for supplying $2^n$ (n is an integer not less than "2") number of different types of potentials to said bit lines according to input data at the time of writing data.

Preferably, the device further comprises a discrimination means for comparing potentials generated at the bit lines with (2-1) number of different types of reference potentials to discriminate the stored data.

Preferably, it further comprises a plurality of switching means provided corresponding to the bit lines and connecting the bit lines to at least one of the potential generating means and the discrimination means and a column address decoder for instructing connection to a switching means selected according to a column address of a cell to be accessed.

Preferably, it further comprises a row address decoder for supplying a predetermined potential to a bit line selected according to a row address of a cell to be accessed.

Preferably, the ferroelectric capacitors are arranged near the points of intersection of the word lines and bit lines to form a matrix.

According to a second aspect of the present invention, there is provided a ferroelectric storage device comprising word lines; bit lines; ferroelectric capacitors; transistors switching the bit lines and one of the electrodes of the ferroelectric capacitors selectively to a connected state and disconnected state; a potential generating means for supplying $2^n$ (n is an integer not less than "2") number of different types of potentials to said bit lines according to input data at the time of writing data; and a discrimination means for comparing potentials to said bit lines generated at the bit lines with ($2^n-1$) number of different types of reference potentials to discriminate the stored data.

Preferably, the device further comprises a plurality of switching means provided corresponding to the bit lines and connecting the bit lines to at least one of the potential generating means and the discrimination means and a column address decoder for instructing connection to a switching means selected according to a column address of a cell to be accessed.

In the first and second aspects of the invention, preferably, the ferroelectric capacitors are essentially constituted by ((Pb,La)(Zr,Ti)O$_3$) or (Pb(Zr,Ti)O$_3$). Alternatively, preferably, the ferroelectric capacitors are essentially constituted by Bi$_2$SrTa$_2$O$_9$.

In the ferroelectric memory device of the present invention, at the time of reading data, a charge in accordance with the state of residual polarization of the ferroelectric of the ferroelectric capacitor, that is, the stored data, flows into the bit line and the potential of the bit line changes. The potential of the bit line is compared with the ($2^n-1$) number of reference data at the discrimination means where it is decided which data among the $2^n$ types of data is the stored data.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, an explanation will be made of a ferroelectric nonvolatile memory according to an embodiment of the present invention.

Figure 1:
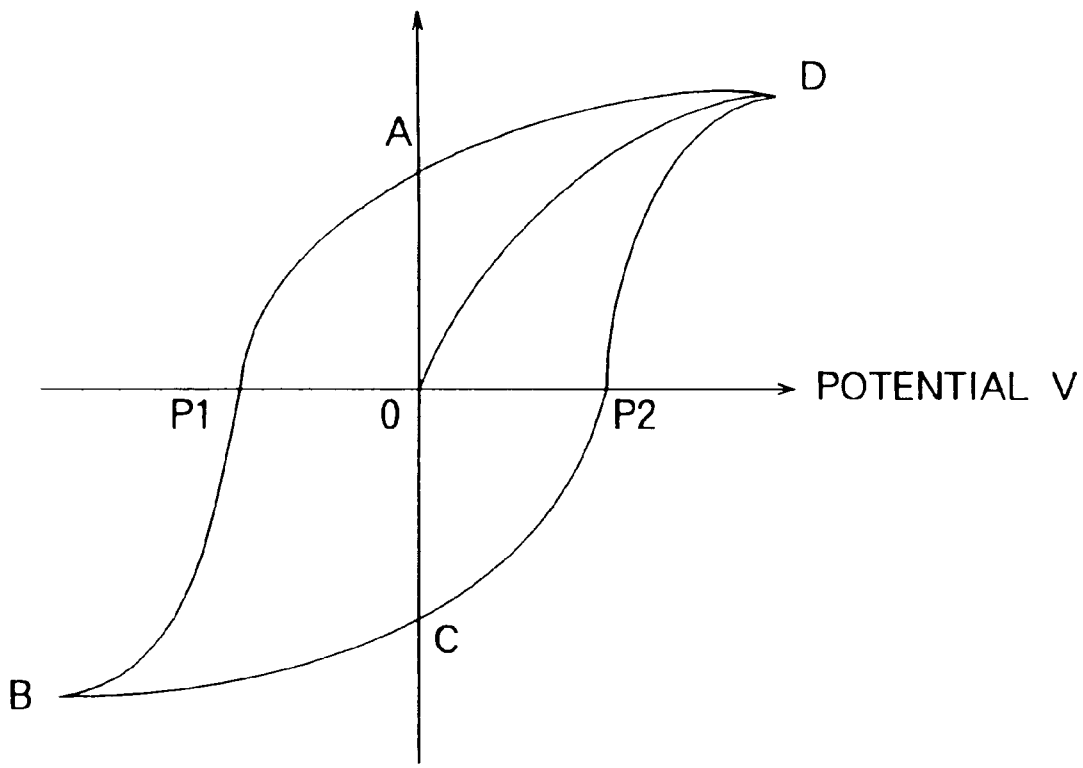
FIG. 1 is a view of a hysteresis characteristic of a ferroelectric for explaining a data storage state in a ferroelectric nonvolatile memory for storing binary data according to the related art.
Figure 2:
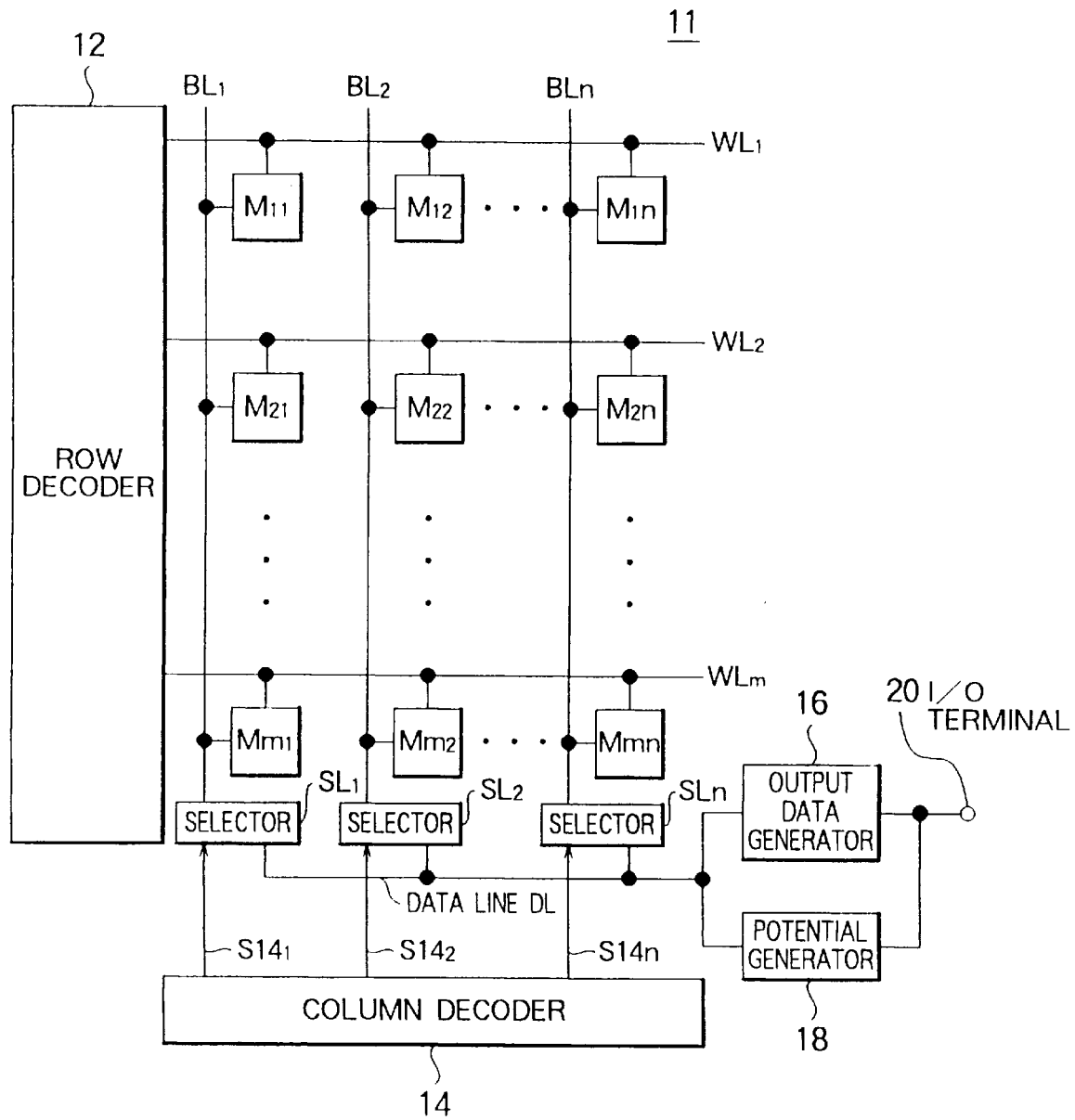
FIG. 2 is a view of the overall configuration of a ferroelectric nonvolatile memory according to an embodiment of the present invention.

FIG. 2 is a view of the overall configuration of a ferroelectric nonvolatile memory 11 of the present embodiment.

The ferroelectric nonvolatile memory 11 achieves double the storage capacity with the same chip size, compared with the case of storing binary data, by storing quaternary (4-level) data in a memory cell.

As shown in FIG. 2, the ferroelectric nonvolatile memory 11 has a row decoder 12, a column decoder 14, an output data generator 16, a potential generation 18, an I/O terminal 20, n×m number of memory cells $M_{11}$ to $M_{mn}$, n number of selectors $SL_1$ to $SL_n$, n number of bit lines $BL_1$ to $BL_n$, and m number of word lines $WL_1$ to $WL_m$.

The bit lines $BL_1$ to $BL_n$ and word lines $WL_1$ to $WL_m$ are arranged so as to intersect with each other.

The bit lines $BL_1$ to $BL_n$ are connected to a data line DL via selectors $SL_1$ to $SL_n$, respectively. The selectors $SL_1$ to $SL_n$ receive as input selection signals $S14_1$ to $S14_n$ from the column decoder 14.

The data line DL is connected to the I/O terminal 20 via the output data generator 16 and the potential generator 18 connected in parallel.

The word lines $WL_1$ to $WL_m$ are connected to the row decoder 12.

In the vicinity of the intersecting points of the bit lines $BL_1$ to $BL_n$ and the word lines $WL_1$ to $WL_m$, memory cells $M_{11}$ to $M_{mn}$ connected to intersecting bit lines and word lines are provided. Namely, the memory cells $M_{11}$ to $M_{mn}$ are arranged in the form of a matrix.

For example, in the vicinity of the intersecting points of the word line $WL_1$ and the bit lines $BL_1$ to $BL_n$, the memory cells $M_{11}$ to $M_{1n}$ respectively connected to the word line $WL_1$ and the bit lines $BL_1$ to $B_n$ are arranged.

Next, an explanation will be made of the configuration of the memory cell $M_{11}$ shown in FIG. 2.

Note that the memory cells $M_{12}$ to $M_{mn}$ have the same configuration as that of the memory cell $M_{11}$.

Figure 3:
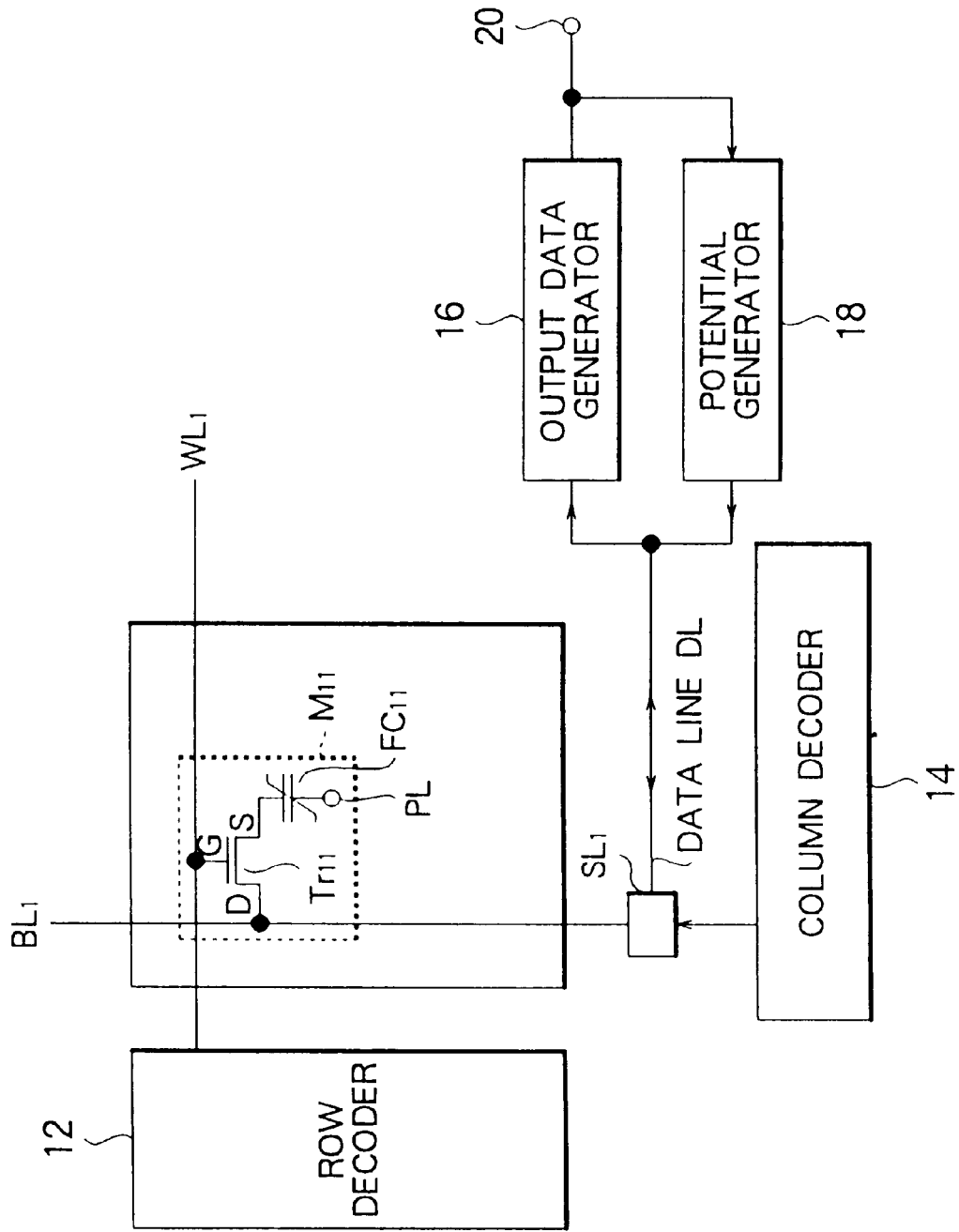
FIG. 3 is a view of the configuration of a memory cell shown in FIG. 2.

FIG. 3 is a view of the configuration of the memory cell $M_{11}$.

As shown in FIG. 2, the memory cell $M_{11}$ is provided with an n-channel switching transistor $Tr_{11}$ and a ferroelectric capacitor $FC_{11}$ by the 1Tr+1Cap method. Namely, the memory cell $M_{11}$ does not use a so-called dummy cell.

A gate (G) of the switching transistor $Tr_{11}$ is connected to the word line $WL_1$, a drain (D) is connected to the bit line $BL_1$, and a source (S) is connected to one end of the ferroelectric capacitor $FC_{11}$. The other end of the ferroelectric capacitor $FC_{11}$ is connected to a plate line PL.

The ferroelectric capacitor $FC_{11}$ is constituted by using a ferroelectric such as PLZT (Pb,La)(Zr,Ti)$O_3$) and PZT (Pb) (Zr,Ti)$O_3$) or SBT ($Bi_2SrTa_2O_9$).

Figure 4:
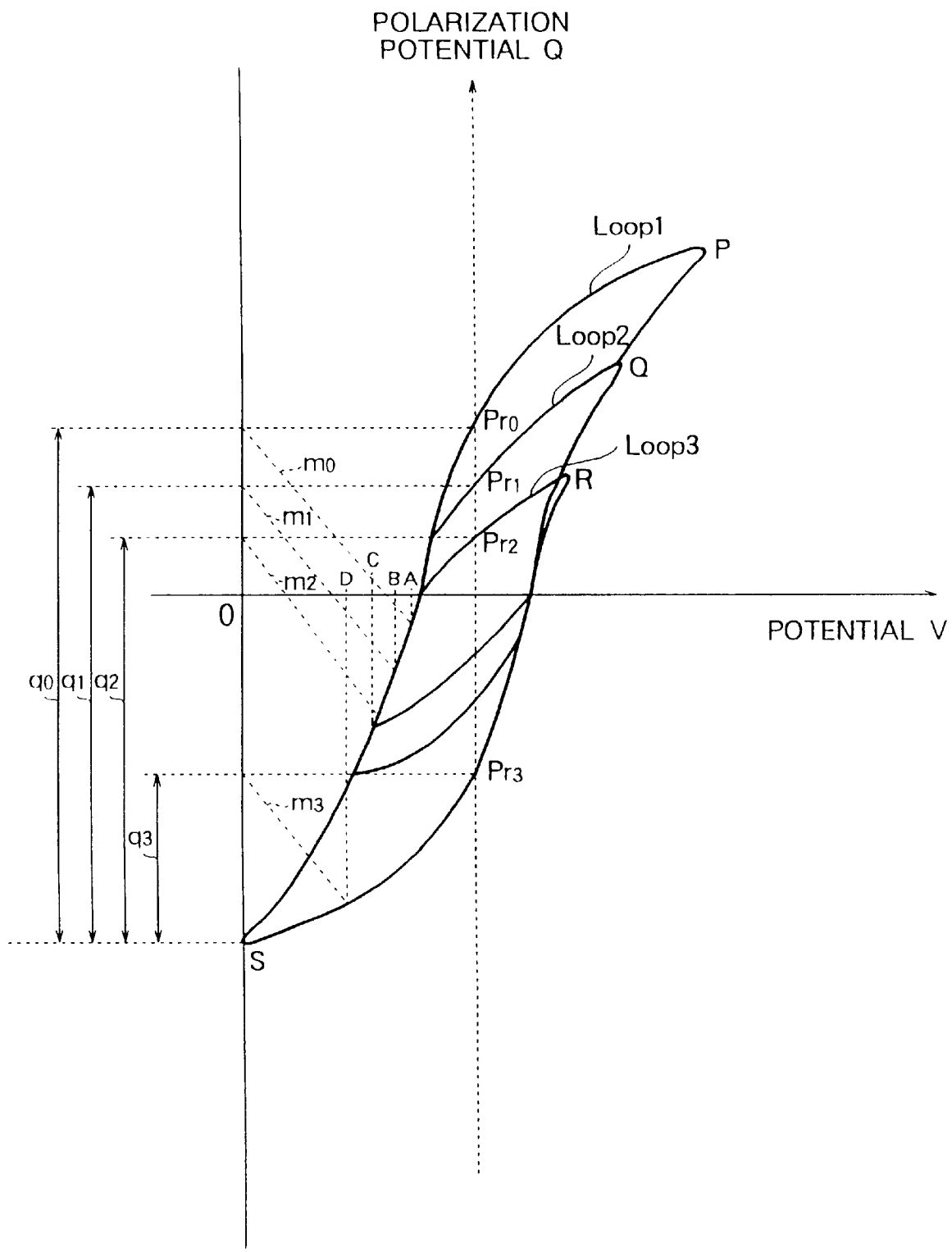
FIG. 4 is a view of the hysteresis characteristic of a ferroelectric for explaining a data storage state in a ferroelectric capacitor of the memory cell shown in FIG. 2 and FIG. 3.

The memory cell $M_{11}$ stores quaternary data (2 bits of data) by supplying four types of potential from the potential generator 18 to the bit line $BL_1$ through the data line DL in accordance with the data input from the I/O terminal 20 and, as shown in FIG. 4, generating four types of residual polarization states having residual polarization charges $Pr_0$, $Pr_1$, $Pr_2$, and $Pr_3$ in the ferroelectric of the ferroelectric capacitor $FC_{11}$.

Figure 5:
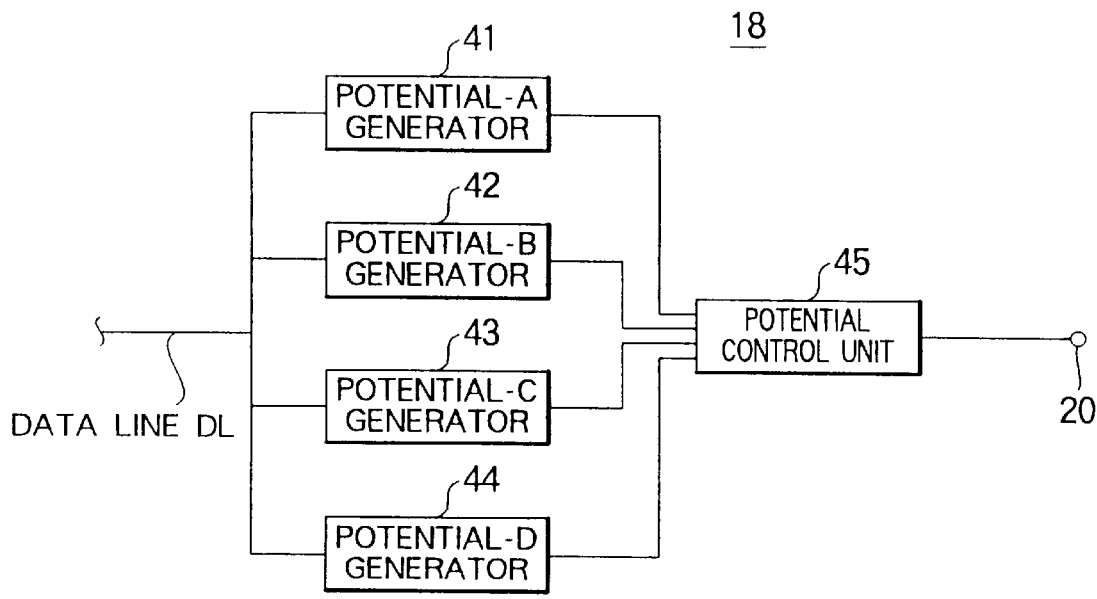
FIG. 5 is a view of the configuration of a potential generator shown in FIG. 2.

The potential generator 18 has a potential-A generator 41, a potential-B generator 42, a potential-C generator 43, a potential-D generator 44, and a potential control unit 45 as shown in FIG. 5.

The potential control unit 45 receives as its input 2 bits of data from the I/O terminal 20, issues an output instruction to the potential-A generator 41 if this data is (1, 1), issues an output instruction to the potential-B generator 42 if this data is (1, 0), issues an output instruction to the potential-C generator 43 if this data is (0, 1), and issues an output instruction to the potential-D generator 44 if this data is (0, 0).

The potential-A generator 41, potential-B generator 42, potential-C generator 43, and potential-D generator 44 output a potential A, potential B, potential C, and potential D, respectively, to the data line DL when receiving as their inputs the output instruction from the potential control unit 45. Here, the potentials A, B, C, and D have a relationship of potential A>potential B>potential C>potential D.

Figures 7, 8:
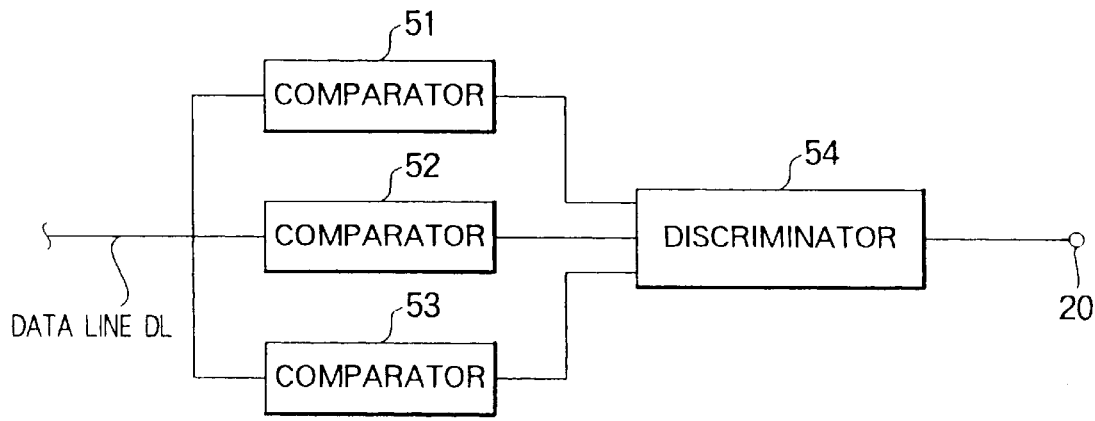
FIG. 7 is a view of the configuration of an output data generator shown in FIG. 2.
FIG. 8 is a view for explaining a discrimination processing in a discriminator shown in FIG. 7.

The output data generator 16 has a comparator 51, a comparator 52, a comparator 53, and a discriminator 54 as shown in FIG. 7.

Figure 6:
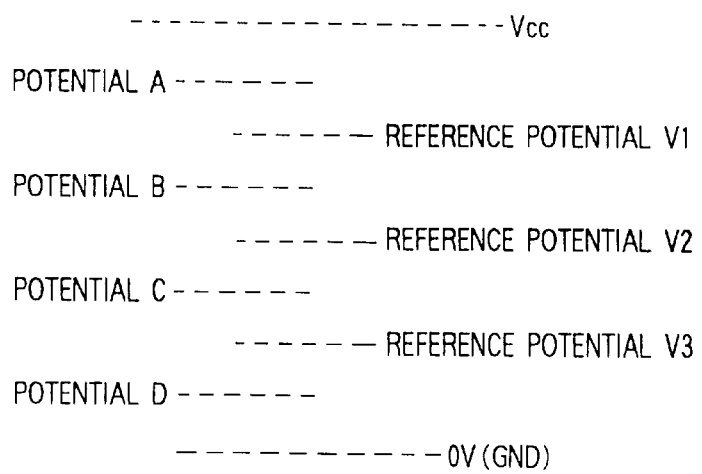
FIG. 6 is a view explaining the relationships between the potentials A, B, C, and D of the bit line at the time of a read operation, which correspond to the contents of the stored data, and reference potentials V1, V2, and V3 of comparators shown in FIG. 6.

The comparator 51 stores a reference potential V1 shown in FIG. 6, compares this reference potential V1 and the potential of the data line DL, and outputs "1" as the comparison result to the discriminator 54 if the potential of the data line DL is higher. Here, the reference potential V1 is an intermediate potential between the potential A of the potential of the bit line when reading the data (1, 1) and the potential B of the potential of the bit line when reading the data (1, 0).

Note that, as shown in FIG. 6, the potentials A, B, C, and D are potentials between 0 V (ground potential) and Vcc (power supply potential), and there is a relationship of potential A>potential B>potential C>potential D.

The comparator 52 stores a reference potential V2 shown in FIG. 6, compares this reference potential V2 and the potential of the data line DL, and outputs "1" as the comparison result to the discriminator 54 if the potential of the data line DL is higher. Here, the reference potential V2 is an intermediate potential between the potential B of the potential of the bit line when reading the data (1, 0) and the potential C of the potential of the bit line when reading the data (0, 1).

The comparator 53 stores a reference potential V3 shown in FIG. 6, compares this reference potential V3 and the potential of the data line DL, and outputs "1" as the comparison result to the discriminator 54 if the potential of the data line DL is higher. Here, the reference potential V3 is an intermediate potential between the potential C of the potential of the bit line when reading the data (0, 1) and the potential D of the potential of the bit line when reading the data (0, 0).

The discriminator 54 outputs (1, 1) as the discrimination result to the I/O terminal 20 when the comparison results from the comparators 51, 52, and 53 are "1", "1", and "1" as shown in FIG. 6. This state is exhibited when the residual polarization charge of the memory cell $M_{11}$ has become the $Pr_0$ shown in FIG. 4 and the potential of the bit line $BL_1$ becomes the potential A as a result of a read operation where for example a read operation of the memory cell $M_{11}$ is carried out. Namely, this is a case where (1, 1) is stored in the memory cell Further, the discriminator 54 outputs (1, 0) as the discrimination result to the I/O terminal 20 when the comparison results from the comparators 51, 52, and 53 are "0", "1", and "1" as shown in FIG. 8. This state is exhibited when the residual polarization charge of the memory cell $M_{11}$ has become the $Pr_1$ shown in FIG. 4 and the potential of the bit line $BL_1$ becomes the potential B as a result of a read operation where for example a read operation of the memory cell $M_{11}$ is carried out. Namely, this is a case where (1, 0) is stored in the memory cell $M_{11}$.

Further, the discriminator 54 outputs (0, 1) as the discrimination result to the I/O terminal 20 when the comparison results from the comparators 51, 52, and 53 are "0", "0", and "1" as shown in FIG. 8. This state is exhibited when the residual polarization charge of the memory cell $M_{11}$ has become the $Pr_2$ shown in FIG. 4 and the potential of the bit line $BL_1$ becomes the potential C as the result of a read operation where for example a read operation of the memory cell $M_{11}$ is carried out. Namely, this is a case where (0, 1) is stored in the memory cell $M_{11}$.

Further, the discriminator 54 outputs (0, 0) as the discrimination result to the I/O terminal 20 when the comparison results from the comparators 51, 52, and 53 are "0", "0", and "0" as shown in FIG. 8. This state is exhibited when the residual polarization charge of the memory cell $M_{11}$ has become the $Pr_3$ shown in FIG. 4 and the potential of the bit line $BL_1$ becomes the potential D as the result of a read operation where for example a read operation of the memory cell $M_{11}$ is carried out. Namely, this is a case where (0, 0) is stored in the memory cell $M_{11}$.

Below, an explanation will be made of the operation of the ferroelectric nonvolatile memory 11 explained above.

Write Operation

First, an explanation will be made of a case where (1, 1) is written into the memory cell $M_{11}$ shown in FIG. 2 and FIG. 3 as an example. In this case, 2 bits of data (1, 1) are output to the potential generator 18 via the I/O terminal 20. When the data (1, 1) is input to the potential generator 18, an output instruction is issued from the potential control unit 45 shown in FIG. 5 to the potential-A generator 41, and the potential A is supplied from the potential-A generator 41 to the data line DL in accordance with this. At this time, the column decoder 14 outputs the selection signal $S14_1$ to the selector $SL_1$, and the bit line $BL_1$ and the data line DL are in the connected state. Further, by the row decoder 12, the word line $WL_1$ is switched from a low level to high level. At this time, the plate line PL is held at a low level.

As a result, the polarization state of the ferroelectric capacitor $FC_{11}$ of the memory cell $M_{11}$ changes to a point P along the Loop 1 of the hysteresis characteristic shown in FIG. 4 and the residual polarization charge $Pr_0$ is generated at the time of holding the stored data.

Further, where 2 bits of data (1, 0) are input via the I/O terminal 20, the output instruction is issued from the potential control unit 45 shown in FIG. 5 to the potential-B generator 42, and the potential B is supplied from the potential-B generator 42 to the data line DL in accordance with this.

As a result, the polarization state of the ferroelectric capacitor $FC_{11}$ of the memory cell $M_{11}$ changes to a point Q along the Loop 2 of the hysteresis characteristic shown in FIG. 4 and the residual polarization charge $Pr_1$ is generated at the time of holding the stored data.

Further, where 2 bits of data (0, 1) are input via the I/O terminal 20, the output instruction is issued from the potential control unit 45 shown in FIG. 5 to the potential-C generator 43, and the potential C is supplied from the potential-C generator 43 to the data line DL in accordance with this.

As a result, the polarization state of the ferroelectric capacitor $FC_{11}$ of the memory cell $M_{11}$ changes to a point R along the Loop 3 of the hysteresis characteristic shown in FIG. 4, and the residual polarization charge $Pr_2$ is generated at the time of holding the stored data.

Further, where 2 bits of data (0, 0) are input via the I/O terminal 20, the output instruction is issued from the potential control unit 45 shown in FIG. 5 to the potential-D generator 44, and the potential D is supplied from the potential-D generator 44 to the data line DL in accordance with this.

As a result, the polarization state of the ferroelectric capacitor $FC_{11}$ of the memory cell $M_{11}$ changes to a point S along the Loop 1 of the hysteresis characteristic shown in FIG. 4, and the residual polarization charge $Pr_3$ is generated at the time of holding the stored data. At this time, the potential C is a negative potential of the same magnitude as that of the potential A.

As explained above, in the ferroelectric nonvolatile memory 11, by applying four types of potentials A, B, C, and D, in accordance with the 2 bits of data input via the I/O terminal 20, to one electrode of the ferroelectric capacitor FC, four types of residual polarization states in accordance with three types of hysteresis loops are selectively generated in the ferroelectric of the ferroelectric capacitor FC, and 2 bits of data are stored in one memory cell.

Note that a rewrite operation carried out after a read operation is carried out in the same way as the write operation explained above.

Read Operation

First, an explanation will be made, as an example, of a case where (1, 1) is stored in the memory cell $M_{11}$ shown in FIG. 2 and FIG. 3 and this is read. In this case, after the word line $WL_1$ is switched from a low level to high level by the row decoder 12, the plate line PL is switched from a low level to high level. Further, the column decoder 14 outputs the selection signal $S14_1$ to the switch $SL_1$, and the bit line $BL_1$ and the data line DL has become the connected state.

As a result, the polarization state of the ferroelectric capacitor $FC_{11}$ of the memory cell $M_{11}$ changes to the point S along the Loop 1 of the hysteresis characteristic shown in FIG. 4, a charge qO shown in FIG. 4 in accordance with the residual polarization charge $Pr_0$ flows into the bit line $BL_1$ shown in FIG. 2, and the potential of the bit line $BL_1$ becomes the potential A shown in FIG. 6. Here, as shown in FIG. 4, the potential at an intersecting point of a straight line mO having an inclination in accordance with the capacity of the bit line $BL_1$ and the Loop 1 of the hysteresis characteristic becomes the potential A.

The output data generator 16 receives as its input the potential A of the bit line $BL_1$ via the data line DL and performs comparisons at the comparators 51, 52, and 53 shown in FIG. 7. Then, "1", "1", and "1" are respectively output from the comparators 51, 52, and 53 to the discriminator 54, and it is discriminated at the discriminator 54 that the stored data is (1, 1).

Further, where (1, 0) is stored in the memory cell $M_{11}$ shown in FIG. 2 and FIG. 3 and this is read, after going through a similar operation to that mentioned above, the polarization state of the ferroelectric capacitor $FC_{11}$ of the memory cell $M_{11}$ changes to the point S along the Loop 2 of the hysteresis characteristic shown in FIG. 4, a charge q1 shown in FIG. 4 in accordance with the residual polarization charge $Pr_1$ flows into the bit line $BL_1$ shown in FIG. 2, and the potential of the bit line $BL_1$ becomes the potential B shown in FIG. 6. Here, as shown in FIG. 4, the potential at an intersecting point of a straight line m1 having an inclination in accordance with the capacity of the bit line $BL_1$ and the Loop 2 of the hysteresis characteristic becomes the potential B.

The output data generator 16 receives as its input the potential B of the bit line $BL_1$ via the data line DL and performs comparisons at the comparators 51, 52, and 53 shown in FIG. 7. Then, "0", "1", and "1" are respectively output from the comparators 51, 52, and 53 to the discriminator 54, and it is discriminated at the discriminator 54 that the stored data is (1, 0).

Further, where (0, 1) is stored in the memory cell $M_{11}$ shown in FIG. 2 and FIG. 3 and this is read, after going through a similar operation to that mentioned above, the polarization state of the ferroelectric capacitor $FC_{11}$ of the memory cell $M_{11}$ changes to the point S along the Loop 3 of the hysteresis characteristic shown in FIG. 4, a charge q2 shown in FIG. 4 in accordance with the residual polarization charge $Pr_2$ flows into the bit line $BL_1$ shown in FIG. 2, and the potential of the bit line $BL_1$ becomes the potential C shown in FIG. 6. Here, as shown in FIG. 4, the potential at an intersecting point of a straight line m2 having an inclination in accordance with the capacity of the bit line $BL_1$ and the Loop 3 of the hysteresis characteristic becomes the potential C.

The output data generator 16 receives as its input the potential C of the bit line $BL_1$ via the data line DL and performs comparisons at the comparators 51, 52, and 53 shown in FIG. 7. Then, "0", "0", and "1" are respectively output from the comparators 51, 52, and 53 to the discriminator 54, and it is discriminated at the discriminator 54 that the stored data is (0, 1).

Further, where (0, 0) is stored in the memory cell $M_{11}$ shown in FIG. 2 and FIG. 3 and this is read, after going through a similar operation to that mentioned above, the polarization state of the ferroelectric capacitor $FC_{11}$ of the memory cell $M_{11}$ changes to the point S along the loop 1 of the hysteresis characteristic shown in FIG. 4, a charge q3 shown in FIG. 4 in accordance with the residual polarization charge $Pr_3$ flows into the bit line $BL_1$ shown in FIG. 2, and the potential of the bit line $BL_1$ becomes the potential C shown in FIG. 6. Here, as shown in FIG. 4, the potential at an intersecting point of a straight line m3 having an inclination in accordance with the capacity of the bit line $BL_1$ and the loop 1 of the hysteresis characteristic becomes the potential D.

The output data generator 16 receives as its input the potential D of the bit line $BL_1$ via the data line DL and performs comparisons at the comparators 51, 52, and 53 shown in FIG. 7. Then, "0", "0", and "0" are respectively output from the comparators 51, 52, and 53 to the discriminator 54, and it is discriminated at the discriminator 54 that the stored data is (0, 0).

As mentioned above, in the ferroelectric nonvolatile memory 11, 4-value data (2 bits of data) stored in the ferroelectric capacitor FC of the memory cell can be suitably read.

As explained above, according to the ferroelectric nonvolatile memory 11, quaternary data can be stored in each of the memory cells $M_{11}$ to $M_{mn}$. For this reason, double the storage capacity can be achieved with the same chip size compared with a case of storing binary data in a memory cell.

Note that the ferroelectric nonvolatile memory 11 may be any of the synchronous type or asynchronous type.

The present invention is not limited to the above embodiment.

For example, in the above embodiment, a case of storing 4-value data in each of memory cells $M_{11}$ to $M_{mn}$ was shown by way of example, but it is also possible to generate $2^n$ types of residual polarization states by supplying $2^n$ (n is an integer of 3 or more) types of potentials to the bit line and store $2^n$-level data (n bits of data) in one memory cell.

Further, in the above embodiment, as shown in FIG. 5, the potential generator 18 was provided with four potential generators for outputting predetermined potentials in accordance with the output instructions from the potential control unit 45, but also a structure outputting four types of potentials in accordance with the input data by the use of a single potential generator can be adopted.

Further, in the above embodiment, as the structure of each memory cell, the 1Tr+1Cap method was exemplified, but a 2Tr+2Cap method can be adopted for a memory cell too.

As explained above, according to the ferroelectric memory device of the present invention, an increase of capacity can be achieved without an increase of size.

What I claim is:

1. A ferroelectric storage device comprising:
   word lines;
   bit lines;
   ferroelectric capacitors;
   transistors switching said bit lines and one of the electrodes of said ferroelectric capacitors selectively to a connected state and disconnected state; and
   a potential generating means for supplying $2^n$ (n is an integer not less than "2") number of different types of potentials to said bit lines according to input data at the time of writing data.

2. A ferroelectric storage device as set forth in claim 1, further comprising output data generating means for comparing potentials generated at said bit lines with ($2^n$-1) number of different types of reference potentials to discriminate the stored data.

3. A ferroelectric storage device as set forth in claim 2, further comprising
   a plurality of switching means provided corresponding to said bit lines and connecting said bit lines to at least one of said potential generating means and said output data generating means and
   a column address decoder for instructing connection to a switching means selected according to a column address of a cell to be accessed.

4. A ferroelectric storage device as set forth in claim 3, further comprising a row address decoder for supplying a predetermined potential to a bit line selected according to a row address of a cell to be accessed.

5. A ferroelectric storage device as set forth in claim 1, wherein said ferroelectric capacitors are arranged near the points of intersection of said word lines and bit lines to form a matrix.

6. A ferroelectric storage device as set forth in claim 1, wherein each of said ferroelectric capacitors comprises $((Pb,La)(Zr,Ti)O_3)$ or $(Pb(Zr,Ti)O_3)$.

7. A ferroelectric storage device as set forth in claim 1, wherein each of said ferroelectric capacitors comprises $Bi_2SrTa_2O_9$.

8. A ferroelectric storage device comprising:

word lines;

bit lines;

ferroelectric capacitors;

transistors switching said bit lines and one of the electrodes of said ferroelectric capacitors selectively to a connected state and disconnected state;

a potential generating means for supplying $2^n$ (n is an integer not less than "2") number of different types of potentials to said bit lines according to input data at the time of writing data; and a discrimination means for comparing potentials generated at said bit lines with $(2^n-1)$ number of different types of reference potentials to discriminate the stored data.

9. A ferroelectric storage device as set forth claim 8, further comprising:

a plurality of switching means provided corresponding to said bit lines and connecting said bit lines to at least one of said potential generating means and said discrimination means and a column address decoder for instructing connection to a switching means selected according to a column address of a cell to be accessed.

10. A ferroelectric storage device as set forth in claim 9, wherein each of said ferroelectric capacitors comprises $((Pb,La)(Zr,Ti)O_3)$ or $(Pb(Zr,Ti)O_3)$.

11. A ferroelectric storage device as set forth in claim 9, wherein each of said ferroelectric capacitors comprises $Bi_2SrTa_2O_9$.

* * * * *